United States Patent [19]

Readdie et al.

[11] Patent Number: 5,254,869
[45] Date of Patent: Oct. 19, 1993

[54] ALUMINUM ALLOY/SILICON CHROMIUM SANDWICH SCHOTTKY DIODE

[75] Inventors: John E. Readdie, San Jose; Benjamin H. Kwan, Pleasanton; Jeng Chang, San Jose, all of Calif.

[73] Assignee: Linear Technology Corporation, Milpitas, Calif.

[21] Appl. No.: 722,941

[22] Filed: Jun. 28, 1991

[51] Int. Cl.⁵ .............................. H01L 29/78
[52] U.S. Cl. ............................ 257/485; 257/486; 257/666; 257/669
[58] Field of Search ............... 357/15; 257/485, 486, 257/666, 669

[56] References Cited

U.S. PATENT DOCUMENTS 3,290,127  3/1964  Kahng et al. ............. 257/486
3,599,323  8/1971  Saxena .................... 257/485
3,819,432  6/1974  Kniepkamp ............. 257/486

OTHER PUBLICATIONS

Anantha, 'Schottky,Barrier Diode . . . ', IBM Tech. Discl., vol. 14 No. 1, Jun. 1971, p. 239.

Alcorn, 'Silicon Barrier Layer Metallurgy . . . ', IBM Tech. Discl., vol. 21 No. 6, Nov. 1978, pp. 2403-2405.
Sullivan, 'Evaporated Metal Schottky Diode', IBM Tech,. Discl., vol. 21, No. 7 Nov. 1978, p. 2816.
S. M. Sze, Physics of Semiconductor Devices, pp. 270-311 (2d ed. 1981).

Primary Examiner—Andrew J. James
Assistant Examiner—Stephen D. Meier
Attorney, Agent, or Firm—Mark D. Rowland; Robert W. Morris

[57] ABSTRACT

A Schottky diode is presented which has reduced minority carrier injection and reduced diffusion of the metallization into the semiconductor. These improvements are obtained by interposing a layer comprising a mixture of silicon and chromium between the anode metallization layer and the semiconductor in a Schottky diode. The layer including chromium acts an effective barrier against the diffusion of the metallization layer into the semiconductor, and at the same time reduces the amount of minority carrier injection into the substrate. The layer including chromium requires no addition photolithograpic masks because it can be plasma etched using the metallization layer as a mask after that layer has been patterned.

13 Claims, 4 Drawing Sheets

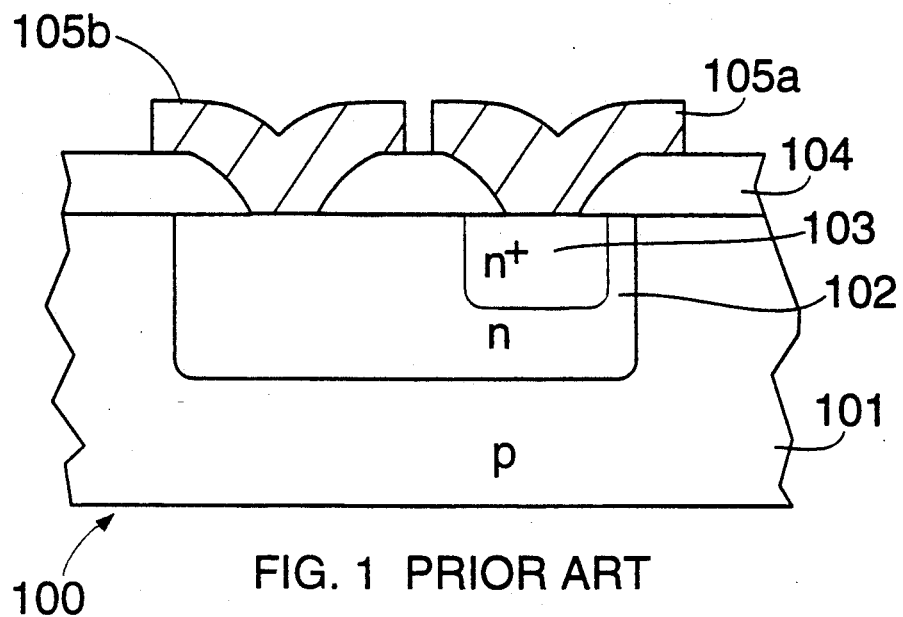
FIG. 1 PRIOR ART
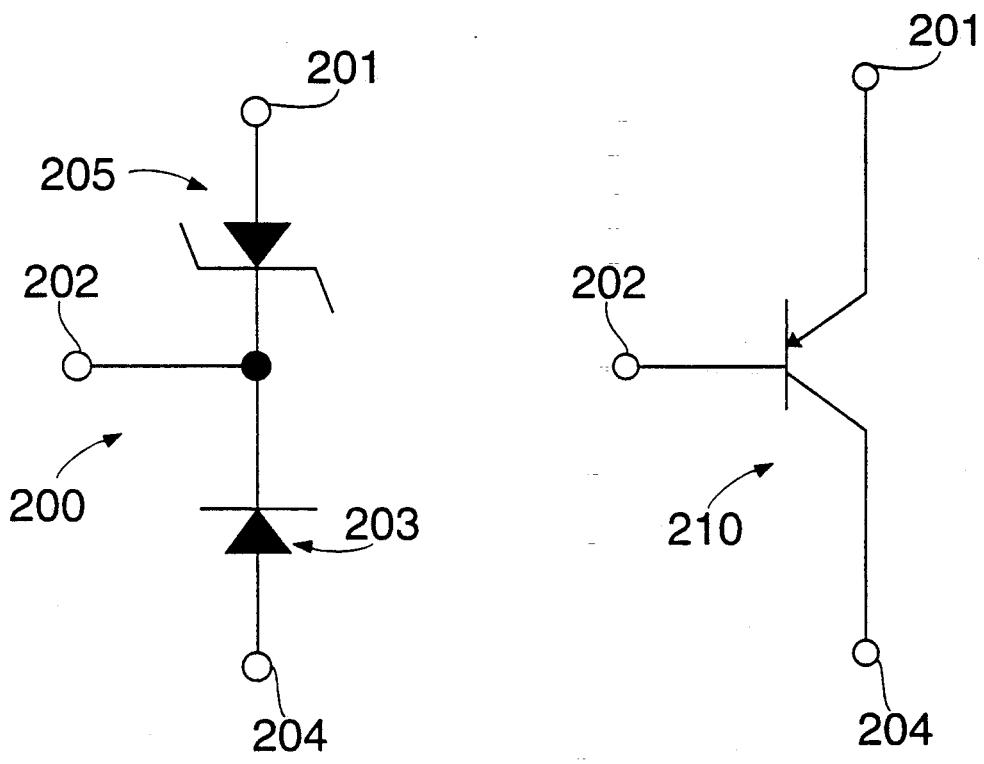
FIG. 2 PRIOR ART
FIG. 3 PRIOR ART

ALUMINUM ALLOY/SILICON CHROMIUM SANDWICH SCHOTTKY DIODE

BACKGROUND OF THE INVENTION

This invention relates to Schottky diodes. More particularly, it relates to Schottky diodes in which minority carrier injection, forward voltage, and metal diffusion are reduced with the use of an intermediary layer including chromium at the metallization-semiconductor interface.

One of the desirable features of a diode is that it should switch rapidly from a conducting state to a non-conducting state when the polarity of the voltage applied to it is switched from a forward biasing condition to a reverse biasing condition. However, in practice, a reverse current usually flows for a short time after the diode is switched to the reverse biased condition. The time taken for this current to become negligible is termed the reverse recovery time, and this time is preferably made as short as possible.

One of the causes of the reverse current which flows during the reverse recovery time is the presence of minority carriers near the diode's junction when the diode is forward biased. When the polarity of the voltage applied to the diode is reversed, these minority carriers flow away from the junction to constitute the reverse current. The number of minority carriers generated determines the total charge that must be removed from the junction area during the reverse current flow, and therefore determines the reverse recovery time. This determines the speed at which diodes can switch. Long reverse recovery times, and hence slow switching speeds, are present in diodes having high levels of minority carrier generation.

Schottky diodes are high-speed diodes which, in theory, minimize the minority carrier generation problem by using only majority carrier conduction. This is accomplished by replacing the semiconductor PN junction in a conventional diode with a metal-semiconductor rectifying junction in which minority carrier generation is significantly lower. Such a metal-semiconductor junction ideally reduces the reverse recovery time of Schottky diodes to zero, and the diodes can therefore switch at high speed.

In practice, minority carrier generation and injection is not completely eliminated in conventional metal-semiconductor Schottky diode junctions. For example, in conventional Schottky diode junctions formed by making contact between an aluminum-based (e.g., Al:1%Si or Al:1.5%Cu:1%Si) metallization layer and an underlying silicon surface, reduced numbers of minority carriers are still generated and injected into the depletion region due to the formation by diffusion of a layer of p-type aluminum doped silicon at the metallization/silicon interface. This can lead to recovery times which are still too long, and can also lead to other effects which can be even more serious.

One such serious effect of minority carrier injection is parasitic transistor operation in an integrated circuit in which Schottky diodes are constructed in an n-type well in a p-type substrate. With this configuration, a significant current can flow to the substrate of the integrated circuit. This current flow can cause the voltage of the substrate to rise and disturb the operation of other parts of the integrated circuit. For example, connection of the substrate contact to ground potential is usually made at a substrate contact pad which may be remote from the Schottky diode. If current flows from the collector of the parasitic PNP transistor to the substrate contact, the resistance of the substrate will cause a voltage drop to appear laterally across a path in the substrate from the Schottky diode to the substrate contact pad. This voltage may be large enough to forward bias junctions of other devices which lie near this path, and thus cause those devices to operate incorrectly. Latch-up in complementary metal-oxide-semiconductor ("CMOS") circuits is an example of such incorrect operation.

The minority carrier injection of a Schottky diode can be further reduced by using a metallization layer of pure aluminum instead of either of the aforementioned AlSi and AlCuSi alloys, but a pure aluminum metallization layer has disadvantageous electrical and metallurgical properties (e.g., low electromigration resistance).

Another problem with some prior Schottky diodes is that the voltage dropped across them when they are forward biased (i.e., the "forward" voltage) may be too high for certain applications, even though this forward voltage is lower than the forward voltage of conventional semiconductor diodes. For a given current, a diode with a lower forward voltage than a conventional diode will have a lower power dissipation than a conventional diode, and this may be critical, for example, in low power applications or where temperature effects are a problem. Additionally, in many cases, Schottky diodes are used as clamps across silicon diodes to prevent conduction of the silicon diode and to eliminate minority carrier storage effects. In these cases, if the forward voltage of the Schottky diode was to be reduced further, there would be a greater voltage margin before the onset of conduction of the silicon diode.

Still another problem with some previously known Schottky diodes, in which a layer of non-aluminum metal (e.g., titanium tungsten) or metal silicide (e.g., platinum silicide) is formed between the aluminum-based metallization layer and the silicon, is the diffusion of aluminum or other metallization material through the metal-semiconductor interface into the silicon. This can degrade the diode's performance significantly because the junction may revert to a aluminum-semiconductor junction rather than one between the intended metal and the semiconductor.

The metal-semiconductor rectifying junction of conventional Schottky diodes have been formed using aluminum evaporation or sputtering techniques. Aluminum is the most commonly used base metal material because Schottky diodes using this material can be fabricated easily and simultaneously with ohmic contacts for other devices in the integrated circuit. As stated above, other materials such as platinum silicide or tungsten titanium, which have desirable properties, also have been used for the metal-semiconductor interface but, unlike aluminum, these typically require that one or more special process steps be added to a conventional integrated circuit process flow, and thus their use in a Schottky diode significantly increases the complexity of the integrated circuit manufacturing process.

In view of the foregoing, it would be desirable to provide a Schottky diode in which minority carrier injection is minimized.

It would further be desirable to provide a Schottky diode in which the forward voltage is reduced.

It would still further be desirable to provide a Schottky diode in which a layer is formed to reduce the diffusion of metal from a metallization layer into the semiconductor.

It would yet further be desirable to provide a Schottky diode wherein the metal-semiconductor interface is formed using a material which is commonly used in conventional integrated circuit manufacture, is relatively easy to process and may be used to form other device structures simultaneously.

SUMMARY OF THE INVENTION

It is an object of the invention to provide a Schottky diode in which minority carrier injection is reduced.

It is also an object of this invention to provide a Schottky diode having a low forward voltage.

It is a further object of this invention to provide a Schottky diode wherein the metal-semiconductor interface is formed using a material which is commonly employed in conventional integrated circuit manufacture, and which can be processed easily and utilized simultaneously to form other integrated circuit structures.

In accordance with this invention, there is provided a Schottky diode in which a layer including chromium, silicon, and carbon is interposed at the metal-semiconductor rectifying junction. The layer including chromium, silicon, and carbon can be conveniently formed by sputtering from a target which is commonly used in the construction of thin film resistors in conventional silicon integrated circuit manufacture. Conventional metallization material such as aluminum, or an aluminum, copper, and silicon mixture, can be deposited onto the layer including chromium. By being able to use a metallization layer with copper and silicon (instead of just pure aluminum), advantages in hillock suppression, electromigration resistance, and reduced junction spiking can be afforded without the aforementioned disadvantages of forming the rectifying junction of a Schottky diode using this type of metallization alloy. The layer including chromium can be etched after the metallization layer is patterned without destruction of the metallization (i.e., the chromium layer is self-aligning). The interface of the present invention greatly reduces minority carrier injection in the Schottky diode and provides a low forward voltage. In addition, the layer including chromium provides an effective barrier which at least substantially reduces the diffusion of the metallization layer into the semiconductor.

BRIEF DESCRIPTION OF THE DRAWINGS

The above and other objects and advantages of the invention will be apparent upon consideration of the following detailed description taken in conjunction with the accompanying drawings in which like reference characters refer to like parts throughout and in which:

FIG. 1 is an examplary schematic cross-section of a typical prior Schottky diode;

FIG. 2 is an equivalent circuit of the Schottky diode of FIG. 1;

FIG. 3 is an alternative equivalent circuit of the Schottky diode of FIG. 1;

DETAILED DESCRIPTION OF THE INVENTION

Figure 4:
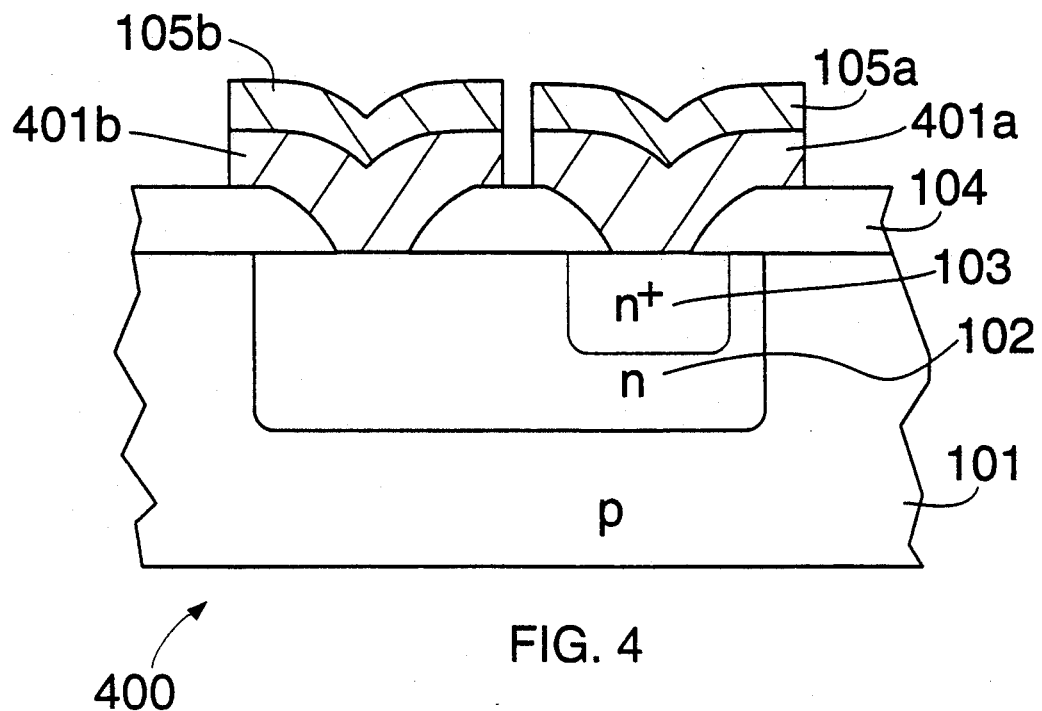
FIG. 4 is an exemplary schematic cross-section of a Schottky diode fabricated at the surface of a semiconductor in accordance with the principles of the present invention.

FIG. 1 shows a simplified cross-section of a portion of an integrated circuit showing a typical conventional Schottky diode 100. Schottky diode 100 comprises a p-type substrate 101, n-type well 102 which forms the cathode of diode 100, n+ region 103 which allows an ohmic contact to be made to n-type well 102, silicon dioxide insulating layer 104 which insulates metallic interconnections from the surface of the integrated circuit, metallic cathode connection 105a, and metallic anode connection 105b. Metallic cathode connection 105a and metallic anode connection 105b can form part of metallization layer 105.

FIG. 2 shows an equivalent circuit 200 of Schottky diode 100. Connection 201 represents the anode and connection 202 represents the cathode of desired Schottky diode 205. The parasitic PN junction formed between p-type substrate 101 and n-type well 102 is represented by parasitic diode 203. Parasitic diode 203 has its cathode connected to the cathode of Schottky diode 205 and its anode connected to substrate terminal 204.

Ideally, no minority carriers are injected into n-type well 102, and only majority carriers (electrons) flow through diode 205 from terminal 202 to terminal 201. Parasitic diode 203 is ideally reverse biased and no current flows through it. However, in practice, minority carriers (holes) are injected from anode 105b into n-type well 102. This can have adverse effects on the Schottky diode. One such adverse effect is a reduction in the speed at which diode 100 can switch.

Preferably, a diode should switch rapidly from a conducting state to a non-conducting state when the polarity of the voltage applied to it is switched from a forward biasing condition to a reverse biasing condition. In practice, a reverse current usually flows for a short time after the diode is switched to the reverse biased condition because of the presence of minority carriers near the junction. When the polarity of the voltage applied to the diode is reversed, these minority carriers flow away from the junction to constitute the reverse current. If many minority carriers are present, the time taken for the reverse current to become negligible is long, and thus the speed at which the diode can switch is undesirably low.

A second adverse effect of the injection of minority carriers is the generation of a substrate current. The minority carriers injected from anode 105b are swept through n-type well 102 into p-type region 101. Thus, transistor action takes place: anode 105b becomes emitter 201, n-type well 102 becomes base 202, and p-type region 101 becomes collector 204 of parasitic PNP transistor 210 shown in FIG. 3. The flow of current from parasitic emitter 201 to parasitic collector 204 can raise the voltage of collector 204, for example if this collector is coupled via a resistive path to ground. Raising the voltage of collector 204 can cause significant problems, such as latch-up, in other parts of an integrated circuit constructed in substrate 101 as described above.

Besides speed reduction and substrate current caused by minority carrier injection, the performance of Schottky diodes using structure 100 is also degraded by the diffusion of metal atoms from metallization layer 105, particularly metal connection 105b, into n-type well 102. This too can have an adverse effect on the properties of the diode.

It has now been discovered that both the problem of minority carrier generation during operation and the problem of metallization diffusion during manufacture can be reduced by manufacturing a Schottky diode in accordance with the present invention using a structure such as exemplary structure 400 shown in FIG. 4.

Structure 400 differs from structure 100 in that layer 401, comprising a mixture of silicon, chromium, and carbon, is included. Up to the deposition of metallization layer 105, structure 400 can be manufactured in the same way that conventional Schottky diodes are manufactured. However, in the present invention, prior to the deposition of layer 105, layer 401 is formed. As an example, applicants have found that layer 401 can be sputter deposited from a sputter target comprising a mixture 30% chromium, 50% silicon, and 20% carbon. Alternatively, it may be possible, in accordance with the invention, to eliminate the carbon, substitute a different element for the carbon, or supplement the carbon with additional elements. The effectiveness of such an alternative can be determined empirically.

Layer 401 must be chosen to be sufficiently thick to prevent substantial diffusion of metallization through to the silicon. Preferably, it is sufficiently thick to prevent any such diffusion. If layer 401 is not thick enough, such that a significant amount of the metallization layer may diffuse through it, the junction may revert to a conventional metal-semiconductor junction so that the advantageous effects of reduced minority carrier generation and reduced forward voltage are lost. On the other hand, because the diode's series resistance increases with the thickness of layer 401, it is preferred that layer 401 should not be made excessively thick. Applicants have found that a layer approximately 100 Angstroms thick provides a suitable diffusion barrier and an acceptable sheet resistance of 500 ohms per square.

After the formation of layer 401, metallization layer 105 can be formed in a conventional way. The metallization can be etched in a conventional way, and the resulting pattern can be used as a mask for plasma etching of the layer including chromium. Wafer processing can then continue as in a conventional manufacturing process.

Although no additional masking steps are required for the manufacture of structure 400, it can be advantageous to include an additional masking step. For example, because the contact resistance between a layer including chromium and a p+ silicon region can be undesirably high, it may be useful, in CMOS circuits using the chromium and silicon layer of the present invention, to include an additional masking step to remove the silicon and chromium mixture from contact holes to p+ regions. The additional masking step may also be used to remove the silicon and chromium mixture from other regions where its presence may be unnecessary or disadvantageous. For example, the mixture could also be removed from contact holes to n+ regions because its presence there is unnecessary and may increase the contact resistance.

Minority carrier injection in Schottky diode 100 is significantly reduced by using structure 400. The extent of the minority carrier injection can be measured by plotting the current gain of parasitic transistor 210 against its emitter current density. Current gain $\alpha$ is defined as the ratio of the parasitic collector current to the parasitic emitter current, and the parasitic emitter current density $J_E$ is defined as the ratio of the parasitic emitter current to the diode area. A large value of $\alpha$ indicates that a large proportion of the Schottky diode current is composed of minority carrier motion and that this current moves by parasitic transistor action to the substrate. Thus, a large value of $\alpha$ is undesirable.

Figure 5:
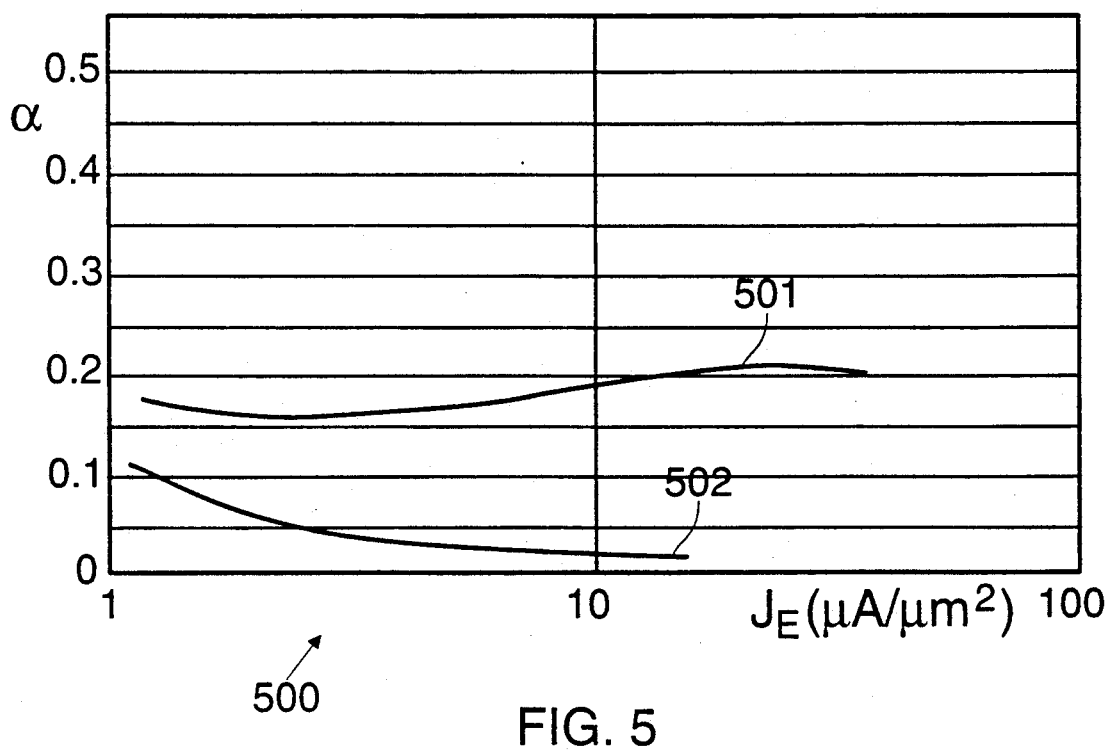
FIG. 5 is a graph showing the parasitic transistor current gain plotted against parasitic emitter current density for a conventional Schottky diode and for a Schottky diode fabricated at the surface of a semiconductor in accordance with the principles of the present invention.

FIG. 5 shows a plot of measured parasitic transistor current gain $\alpha$ against emitter current density $J_E$ for two Schottky diodes which are essentially identical except for the presence of layer 401. Trace 501 shows the characteristics of a Schottky diode constructed in accordance with conventional manufacturing techniques using structure 100, and trace 502 shows the characteristics of an essentially identical Schottky diode constructed in accordance with the principles of the present invention using structure 400 including layer 401. In this embodiment, layer 401 was sputter-deposited from a target comprising a mixture of 30% chromium 50% silicon, and 20% carbon. The measurements were made after layer 401 was etched and subjected to a 430° C. nitrogen heat treatment. For all values of current density, trace 502 lies below trace 501. This illustrates that the Schottky diode constructed in accordance with the principles of the present invention (with layer 401) had lower minority carrier injection into the substrate than the conventional Schottky diodes (without layer 401).

FIG. 5 shows that, at a conventionally used current density of 10 microamps per square micrometer, the current gain $\alpha$ for the conventional Schottky diode using structure 100 is 0.183 (i.e., 18.3% of the diode current passes to the substrate), whereas the current gain $\alpha$ for an essentially identical Schottky diode manufactured in accordance with the present invention is 0.012 (i.e., only 1.2% of the diode current passes to the substrate). Thus, it can be seen that the inclusion of a layer including chromium reduces minority carrier injection substantially.

In addition to reducing the minority carrier injection problem, the chromium in layer 401 also slows the diffusion of elements from metallization layer 105 into Schottky diode 400. At the normal temperatures used in semiconductor manufacturing, the reaction between aluminum and chromium will not proceed to the silicon surface. Thus, the second problem with prior Schottky diodes is also alleviated.

Figure 6:
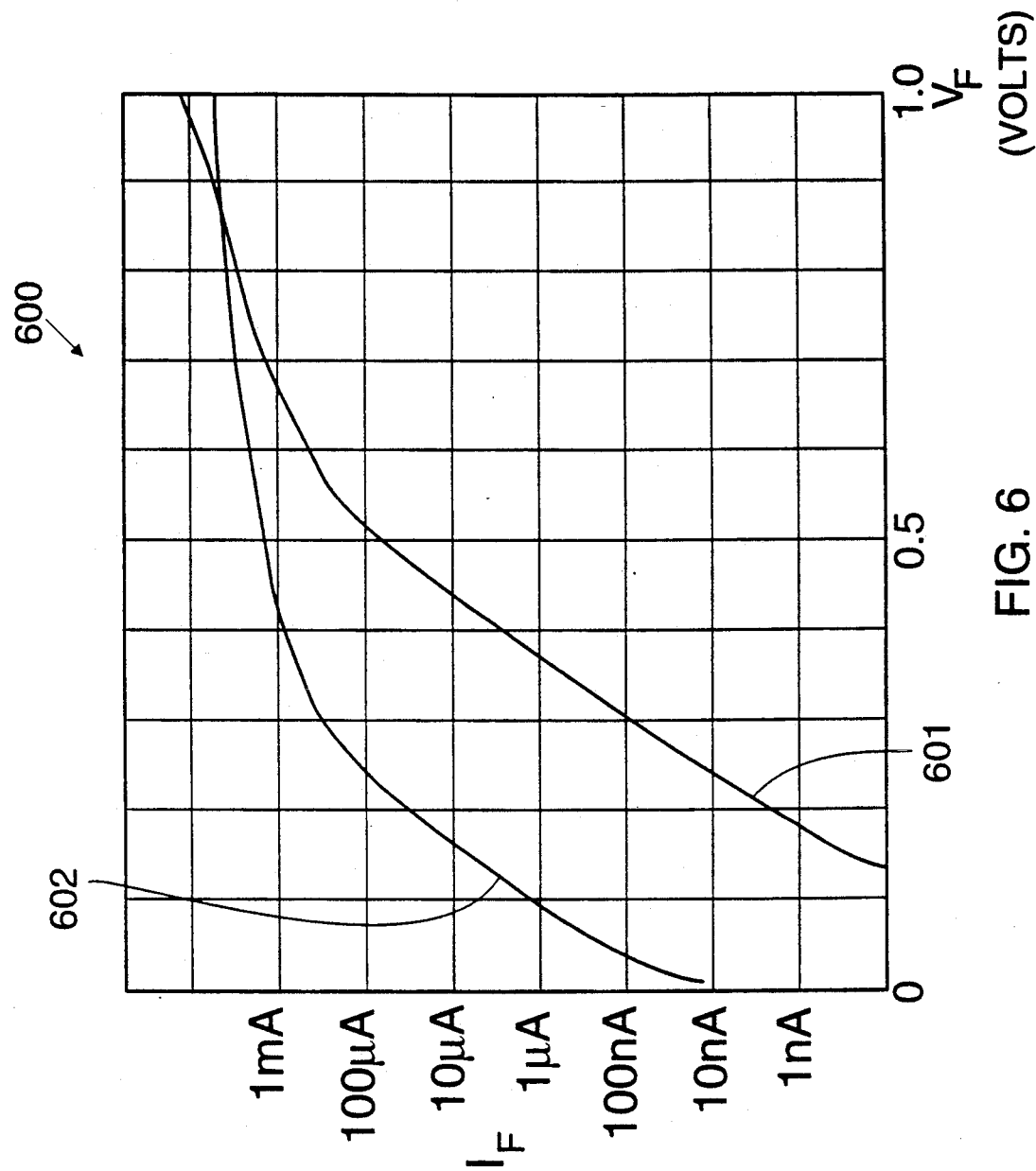
FIG. 6 is a graph showing the logarithm of the magnitude of the current flowing through a conventional Schottky diode and through a Schottky diode fabricated at the surface of a semiconductor in accordance with the principles of the present invention, plotted against the voltage across the diodes.

The third problem alleviated by the present invention is the magnitude of the forward voltage which can be too large for certain applications. The forward voltage is determined by the difference between the work function of the silicon and that of the metal in contact with the silicon. Silicon has a work function which is closer to that of chromium than that of aluminum. Thus, as desired, the inclusion of a chromium and silicon layer reduces the forward voltage. This is illustrated in FIG. 6 which shows logarithmic graph 600 of measured current versus voltage ("I-V") curves for two Schottky diodes which are essentially identical except for the presence of layer 401. Trace 601 shows the I-V characteristics of a Schottky diode constructed in accordance with conventional manufacturing techniques using structure 100, and trace 602 shows the I-V characteristics of an essentially identical Schottky diode constructed in accordance with the principles of the present invention using structure 400 including layer 401. For forward currents between 10 nA and 100 μA, curve 602 is displaced by more than 250 mV to the left of curve 601; i.e., the forward voltage across the diode of the present invention is at least 250 mV less than the forward voltage across the conventional Schottky diode. Thus, the inclusion of the layer including chromium has achieved the desired effect of reducing the forward voltage. As the current through the diodes increases, the forward voltage becomes dominated by voltage drop across the parasitic series resistance of the diodes. I the diodes whose logarithmic I-V curves are shown in FIG. 6, this effect is dominant for currents in excess of approximately 100 μA.

Figure 7:
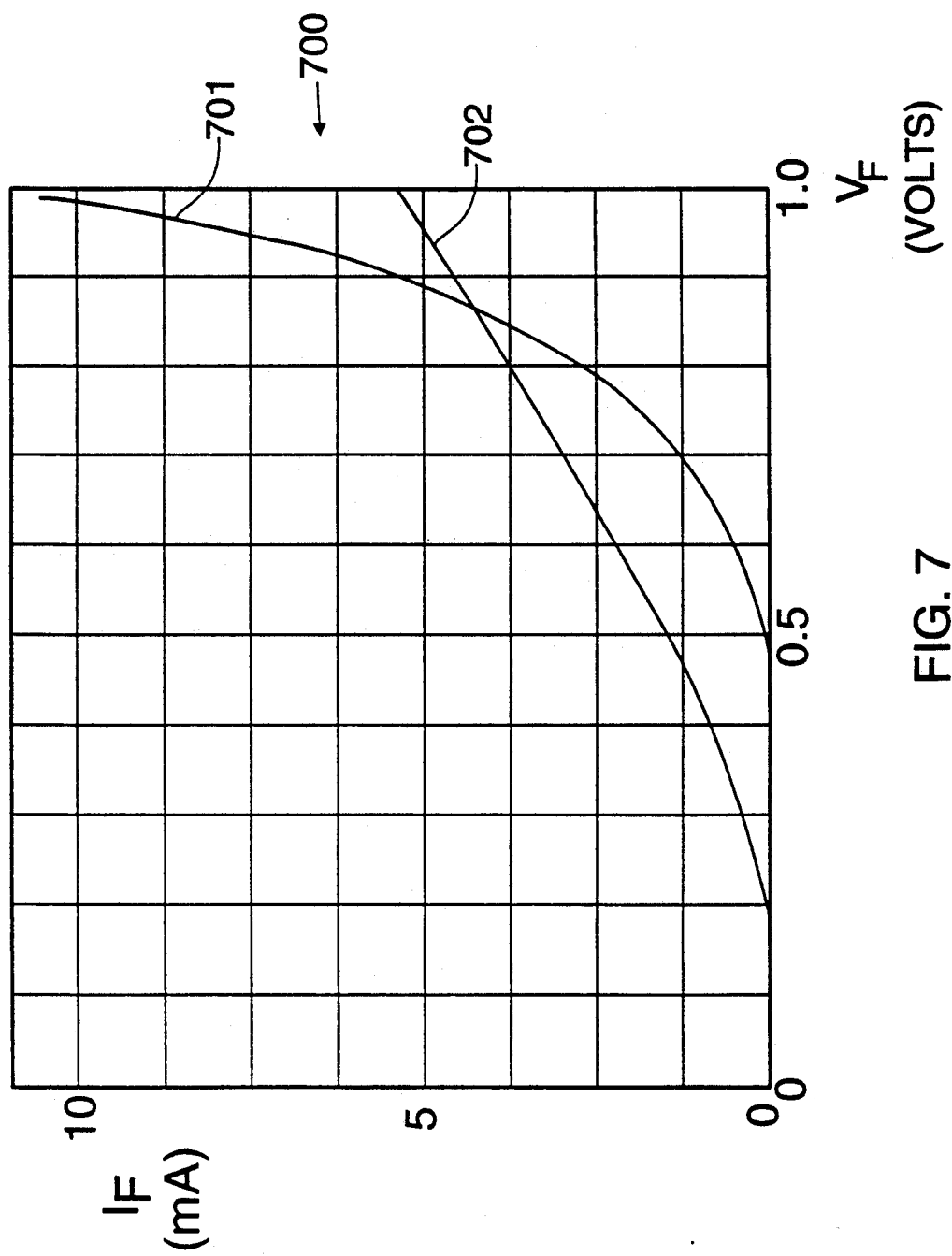
FIG. 7 is a graph showing the magnitude of the current flowing through a conventional Schottky diode and through a Schottky diode fabricated at the surface of a semiconductor in accordance with the principles of the present invention, plotted against the voltage across the diodes.

In this regard, another parameter of the Schottky diode of the present invention which can be obtained from an I-V curve is its series resistance. The series resistance is the reciprocal of the slope of the I-V characteristic. FIG. 7 shows linear graph 700 of measured current versus voltage ("I-V") curves for two Schottky diodes which are essentially identical except for the presence of layer 401. Trace 701 shows the I-V characteristics of a Schottky diode constructed in accordance with conventional manufacturing techniques using structure 100, and trace 702 shows the I-V characteristics of an essentially identical Schottky diode constructed in accordance with the principles of the present invention using structure 400 including layer 401. FIG. 7 shows that the series resistance of the Schottky diode of the present invention is higher than that of a conventional Schottky diode. The series resistance of the Schottky diode of the present invention increases with the thickness of the layer including chromium, whereas the minority carrier generation and diffusion of metallization decreases with thickness. The diode's parameters are also affected by the composition of the layer. Therefore, by varying the thickness and composition of layer 401, a desired balance between speed, forward voltage, and series resistance of a Schottky diode can be achieved empirically.

Thus, a Schottky diode having reduced minority carrier injection, reduced forward voltage, and means to at least substantially reduce the diffusion of metallization into the diode is provided. Persons skilled in the art will appreciate that the present invention can be practiced by other than the described embodiment, which is presented for the purposes of illustration and not of limitation, and the present invention is limited only by the claims which follow.

What is claimed is:

1. An improved integrated circuit Schottky diode having a rectifying junction formed at an interface between a metallization layer and a semiconductor, wherein the improvement comprises a layer formed from a premixed layer having at least three constituents including chromium, silicon, and carbon interposed between the metallization layer and the semiconductor to form the rectifying junction.

2. The improved Schottky diode of claim 1 wherein the semiconductor has a substrate and a surface, the surface has a first region having a first impurity concentration and a second region formed within the first region having a second impurity concentration, the surface being covered with an insulating layer with a first hole passing through the insulating layer adjacent the first region and a second hole passing through the insulating layer adjacent the second region, a first conductor passing through the first hole to contact the first region and a second conductor passing through the second hole to contact the second region, and wherein the layer formed from a premixed layer having at least three constituents including chromium, silicon, and carbon is interposed between the first conductor and the first region.

3. The improved Schottky diode of claim 2 wherein the substrate comprises silicon.

4. The improved Schottky diode of claim 2 wherein the substrate is doped with p-type impurities.

5. The improved Schottky diode of claim 2 wherein the first region is doped with n-type impurities.

6. The improved Schottky diode of claim 2 wherein the second region is doped with n-type impurities and the second concentration is higher than the first concentration.

7. The improved Schottky diode of claim 2 wherein the first conductor comprises aluminum.

8. The improved Schottky diode of claim 2 wherein the first conductor comprises at least one element chosen from the group consisting of aluminum, copper, and silicon.

9. The improved Schottky diode of claim 2 wherein the insulating layer comprises silicon dioxide.

10. The improved Schottky diode of claim 2 wherein the premixed layer is interposed between the second conductor and the second region.

11. The improved Schottky diode of claim 1 wherein the premixed layer includes silicon from a source other than the semiconductor.

12. A Schottky barrier diode contact comprising:
 an impurity-doped silicon substrate having an oxidized surface with a contact hole formed in the oxide exposing an area of the surface of the underlying silicon substrate;
 a layer of multiple elements including silicon, carbon and chromium bonded to the exposed surface area of the underlying silicon substrate to provide a Schottky barrier layer substantially above the exposed surface area of the underlying silicon substrate; and
 a metallization layer electrically coupled to the multiple-element schottky barrier layer.

13. The Schottky barrier diode contact of claim 12, wherein the multiple-element Schottky barrier layer further includes silicon from a source other than the silicon substrate.

* * * * *

UNITED STATES PATENT AND TRADEMARK OFFICE
CERTIFICATE OF CORRECTION

PATENT NO. : 5,254,869
DATED : October 19, 1993
INVENTOR(S) : John E. Readdie, et. al.

It is certified that error appears in the above-indentified patent and that said Letters Patent is hereby corrected as shown below:

```
Title page, item [56], under References Cited, "Schottky, Barrier Diode"
should be --Schottky Barrier Diode --.
Abstract:
Title page, item [57], col. 2, line 7, after "acts", insert -- as--.
                                line 12,"addition" should be--additional--.
                                line 12, "photolithograpic" should be--
                                photolithographic
Column 2, line 43, "a" should be -- an--.
Column 6, line 31, after "chromium", insert comma --, --.
Column 7, line 18, after   "by", insert -- the --.
Column 7, line 20, "I" should be -- For --. (1st occurrence).
```

Signed and Sealed this

Thirteenth Day of December, 1994

Attest:

BRUCE LEHMAN

*Attesting Officer*       Commissioner of Patents and Trademarks